United States Patent [19]
Ohishi et al.

[11] Patent Number: 5,859,551
[45] Date of Patent: Jan. 12, 1999

[54] DIGITAL PLL CIRCUIT

[75] Inventors: Syouji Ohishi; Masaya Tamamura; Koichi Hatta, all of Kawasaki, Japan

[73] Assignee: Fujitsu Limited, Kanagawa, Japan

[21] Appl. No.: 848,675

[22] Filed: Apr. 29, 1997

[30]     Foreign Application Priority Data

Dec. 3, 1996 [JP] Japan .................................. 8-322729

[51] Int. Cl.⁶ ...................................................... H03L 7/06
[52] U.S. Cl. ........................... 327/159; 327/156; 375/375; 375/360
[58] Field of Search ..................................... 327/156, 157, 327/159, 147, 148, 150, 166, 177, 163, 158; 375/359, 360, 373, 375

[56]               References Cited

U.S. PATENT DOCUMENTS

| 5,208,839 | 5/1993 | Hladik et al. | ............................ 375/110 |
| 5,646,968 | 7/1997 | Kovacs et al. | ............................ 327/159 |
| 5,663,688 | 9/1997 | Delmas et al. | ........................... 327/156 |
| 5,745,530 | 4/1998 | Baek et al. | ............................... 375/342 |
| 5,777,498 | 7/1998 | Cometti et al. | ......................... 327/159 |

FOREIGN PATENT DOCUMENTS 8-31110  2/1996  Japan .

*Primary Examiner*—Timothy P. Callahan
*Assistant Examiner*—Jung Ho Kim
*Attorney, Agent, or Firm*—Nikaido Marmelstein Murray & Oram LLP

[57]               ABSTRACT

A digital PLL circuit recovers a clock signal from an analog baseband signal. The PLL circuit has a phase comparator. The phase comparator provides a loop filter with a control value for a period of the recovered clock signal after a determination is made. If the determination is that the baseband signal has crossed a transition level, the control value corresponds to a time difference between a sampling point and a transition-level crossing point of the baseband signal. If the determination is that the baseband signal has not crossed the transition level, the control value is 0. The PLL circuit shortens a lockup time and provides stable operation even if the baseband signal involves an offset.

4 Claims, 18 Drawing Sheets

CONTROLLED
WITH DETECTED
BINARY DATA

SAMPLING AND HOLDING
TRANSITION-LEVEL
CROSSING POINT

DIGITAL PLL CIRCUIT

BACKGROUND OF THE INVENTION

1. Field of the Invention

The present invention relates to a digital PLL circuit, for recovering a clock signal, which is used to regenerate data from an analog baseband signal whose frequency band is limited due to removal of high-frequency components.

2. Description of the Related Art

A digital PLL circuit for recovering a clock signal from an analog baseband signal is disclosed in, for example, Japanese Unexamined Patent Publication No. 8-31110. This PLL circuit has an A/D converter that samples the baseband signal having a limited frequency band. The A/D converter transfers the sampled data to a delay circuit. The delay circuit has "N−1" delay stages to delay the sampled data by N (N≧2) periods of the recovered clock signal. The A/D converter and the delay circuit provide N pieces of digital data in total, which are converted into N binary bits. The N binary bits are transferred to a logic operation unit, which carries out a logic operation on them. Among the N binary bits, two are supplied to an arithmetic operation unit, which calculates the difference or sum of the two and provides the result to a latch circuit. The latch circuit latches the result depending on the output of the logic operation unit and provides a signal for controlling the oscillation frequency of an oscillator. The oscillator provides the recovered clock signal used to regenerate data. The logic operation unit detects a zero crossing point, or in other words, a transition-level crossing point, at which the baseband signal crosses a transition level, in the output of the A/D converter according to the N binary bits and determines whether the inclination of the baseband signal at the crossing point is positive or negative. The polarity of the output of the arithmetic operation unit may be inverted according to the inclination. The logic operation unit controls the latch circuit according to the detected crossing point. The logic operation unit also controls the polarity of the output of the arithmetic operation unit according to whether the inclination is positive or negative. With these operations, the PLL circuit synchronizes the phase of the recovered clock signal with that of the baseband signal.

This prior art, as will be explained later in detail, is incapable of adjusting a frequency if a large phase difference is involved. This results in elongating a lockup time.

An offset involved in the analog baseband signal causes an error in the N binary bits, to destabilize the operation of the PLL circuit.

SUMMARY OF THE INVENTION

An object of the present invention is to provide a digital PLL circuit having a wide lockup range and a short lockup time.

Another object of the present invention is to provide a digital PLL circuit that operates stably even if a baseband signal involves an offset.

In order to accomplish the objects, a first aspect of the present invention provides a digital PLL circuit for recovering a clock signal from an analog baseband signal. The PLL circuit has a phase comparator having a control signal generator that provides a loop filter with a control signal. For a period of the recovered clock signal just after it has been detected that the baseband signal has crossed a transition level, the control signal corresponds to a time difference between a sampling point and a transition-level crossing point. For a period of the recovered clock signal just after it has been detected that the baseband signal has not crossed the transition level, the control signal corresponds to zero.

Only when the baseband signal crosses the transition level, does the phase comparator provides the loop filter with the control signal that corresponds to a time difference between a sampling point and a transition-level crossing point. The PLL circuit of the first aspect is capable of providing such control signal for a phase difference of ±180 degrees. Namely, the PLL circuit can adjust a frequency in a short lockup time even with a large phase difference. Unlike the prior art that detects a phase difference for all phases of the baseband signal, the present invention provides the control signal only when the baseband signal crosses the transition level, thereby avoiding the influence of noise or jitters.

According to a second aspect of the present invention, the frequency of the recovered clock signal is double the nominal frequency of the baseband signal, and the A/D converter samples the baseband signal according to the double-frequency clock signal.

This enables the A/D converter to sample the baseband signal around transition-level crossing points, and enables the phase comparator to provide a more correct time difference between a sampling point and a transition-level crossing point.

According to a third aspect of the present invention, a time difference between a sampling point and a transition-level crossing point of the baseband signal corresponds to a difference between a sampled value and the transition level.

Around a transition-level crossing point of the baseband signal, the baseband signal is substantially straight and inclined by about 45 degrees with respect to a time axis. Accordingly, the difference between a sampled value and the transition level corresponds to a time difference between the sampling point of the sampled value and the crossing point.

According to a fourth aspect of the present invention, the phase comparator changes the polarity of the control signal given to the loop filter according to a binary value sampled in a preceding period of the recovered clock signal and whether the phase of the recovered clock signal is ahead of or behind the phase of the baseband signal.

The fourth aspect surely synchronizes the phase of the recovered clock signal with the phase of the baseband signal.

A fifth aspect of the present invention provides a digital PLL circuit for recovering a clock signal from an analog baseband signal. The PLL circuit has a phase comparator having a transition detector and a phase difference detector. The transition detector determines whether or not the baseband signal has crossed a transition level. The phase difference detector determines whether or not a time difference between a sampling point and a transition-level crossing point is within a given range. If it is determined that the baseband signal has crossed the transition level and that the time difference is within the given range, the phase comparator provides a loop filter with a control signal that corresponds to the time difference for a period of the recovered clock signal just after the determination that the baseband signal has crossed the transition level. If it is determined that the baseband signal has not crossed the transition level, or that the time difference is out of the given range, the phase comparator maintains the preceding control signal.

The fifth aspect provides the control signal that corresponds to a time difference between a sampling point and a transition-level crossing point only when the baseband signal has crossed the transition level and a phase difference is within the given range. If an excessively large value is sampled in the vicinity of a transition-level crossing point due to noise, the fifth aspect keeps the preceding control signal. As a result, the fifth aspect is capable of continuously and properly adjusting a frequency in a short lockup time without the influence of noise.

The sixth to eighth aspects of the present invention add the effects of the second to fourth aspects to the fifth aspect.

According to a ninth aspect of the present invention, the phase comparator of the fifth aspect has a locked-state detector for determining whether or not the PLL circuit is locked, and an output controller for providing zero if the PLL circuit is locked and if the preceding control signal must be kept.

The phase comparator of the ninth aspect provides zero if the PLL circuit is locked. Even if noise momentarily increases a phase difference in the PLL circuit, the phase comparator provides zero instead of a large control signal based on the enlarged phase difference, thereby preventing jitters due to the noise.

A tenth aspect of the present invention provides a digital PLL circuit for recovering a clock signal from an analog baseband signal. The PLL circuit has a phase comparator having a first delay circuit, a second delay circuit, a monotony detector, and a control signal generator. The first delay circuit delays the output of an A/D converter by a period of a double-frequency clock signal recovered from the baseband signal. The second delay circuit delays the output of the first delay circuit by a period of the double-frequency clock signal. The monotony detector detects if the outputs of the A/D converter and first and second delay circuits monotonously increase or decrease. If the monotonous increase or decrease is detected, the control signal generator generates a control signal corresponding to a time difference between a sampling point and a transition-level crossing point of the baseband signal.

Similar to the first aspect, the tenth aspect is capable of providing a control signal corresponding to a time difference for a phase difference in the range of ±180 degrees. The tenth aspect adjusts a frequency in a short lockup time even if there is a large phase difference. The tenth aspect provides the control signal corresponding to a time difference only when the baseband signal monotonously increases or decreases. Unlike the prior art that detects a phase difference for all phases of the baseband signal, the tenth aspect stably adjusts a frequency without the influence of noise or jitter.

According to an eleventh aspect of the present invention, the time difference between a sampling point and a transition-level crossing point corresponds to a difference between the output of the first delay circuit of the tenth aspect and the transition level.

The baseband signal is substantially straight around the transition level and inclined by about 45 degrees with respect to a time axis. Accordingly, a difference between a value sampled around a transition-level crossing point and the transition level is substantially equal to a time difference between the sampling point and the crossing point.

According to a twelfth aspect of the present invention, a time difference between a sampling point of a sampled value b among three sampled values a, b, and c and a transition-level crossing point corresponds to "$n \cdot \{b-(a+c)\}$" where n is a natural number.

Even if an offset d due to noise is added to the sampled values, a phase difference will be "$n \cdot [(b+d)-\{(a+d)+(c+d)\}/2]$"="$n \cdot \{b-(a+c)\}$," to cancel the offset d. Consequently, the operation of the PLL circuit is stable even with the offset.

According to a thirteenth aspect of the present invention, the phase comparator of the tenth aspect has a sign determination unit. If three sampled values show a monotonous increase or decrease, the sign determination unit changes the polarity of the control signal, which corresponds to a time difference and is supplied to the loop filter, according to whether the phase of the recovered clock signal is ahead of or behind the phase of the baseband signal.

Similar to the fourth aspect, the thirteenth aspect surely reduces a phase difference between the recovered clock signal and the baseband signal.

According to a fourteenth aspect of the present invention, the phase comparator of the tenth aspect has a locked-state detector for determining whether or not the PLL circuit is locked, and an output controller for providing zero if the PLL circuit is locked and if the preceding control signal must be kept.

Similar to the ninth aspect, the fourteenth aspect provides zero if the PLL circuit is locked. Namely, the fourteenth aspect carries out only minor adjustment while the PLL circuit is being locked, thereby stabilizing the operation of the PLL circuit.

BRIEF DESCRIPTION OF THE DRAWINGS

The above objects and features of the present invention will be more apparent from the following description of the preferred embodiments when read in conjunction with the accompanying drawings, wherein.

DESCRIPTION OF THE PREFERRED EMBODIMENTS

Before describing the embodiments of the present invention, a digital PLL circuit according to the prior art and the problems thereof will be explained.

Figure 17:
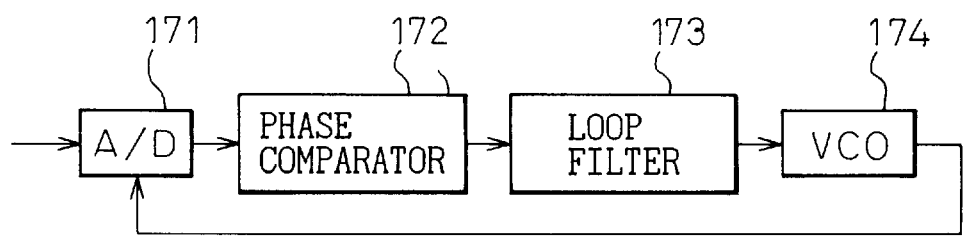
FIG. 17 shows a digital PLL circuit according to a prior art.
Figure 19A:
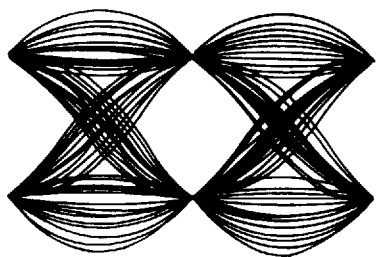
FIGS. 19A and 19B show eye patterns provided by the phase comparator of FIG. 18.

FIG. 17 shows a digital PLL circuit disclosed in the Japanese Unexamined Patent Publication No. 8-31110. An A/D converter 171 converts an analog baseband signal into a digital signal. The baseband signal has a limited frequency band due to removal of high-frequency components and shows binary eye patterns of FIG. 19A. A phase comparator 172 detects a phase difference in the output of the A/D converter 171. A loop filter 173 smooths the output of the phase comparator 172. A voltage-controlled oscillator (VCO) 174 changes the oscillation frequency of itself in response to the output of the loop filter 173 and provides a recovered clock signal, which is used as a sampling clock signal by the A/D converter 171 or as an operation clock signal by other elements.

Figure 18:
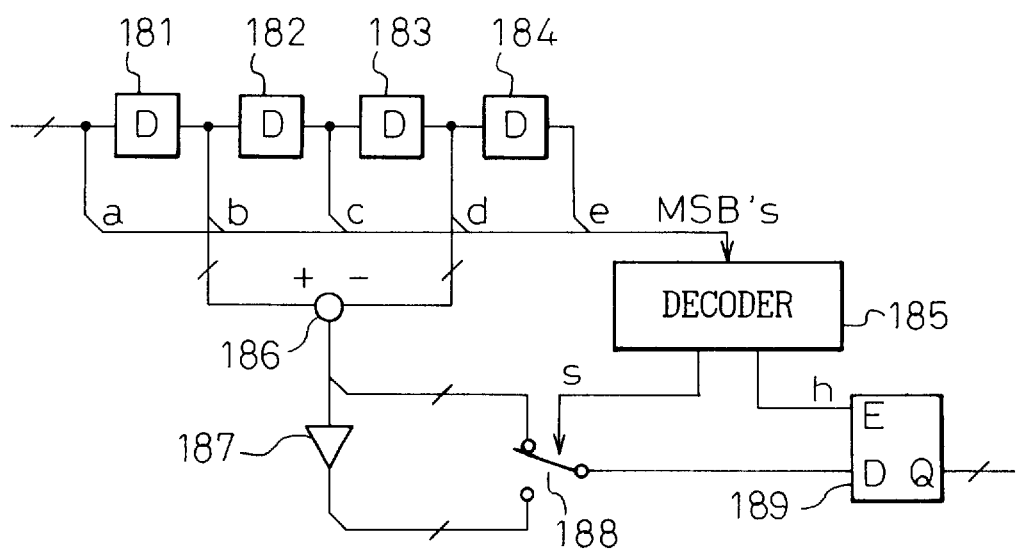
FIG. 18 shows a phase comparator of the PLL circuit of FIG. 17.

FIG. 18 shows the details of the phase comparator 172. Delay circuits 181 to 184 delay digital signals provided by the A/D converter 171 in response to the recovered clock signal. A decoder 185 serves as a logic operation unit for extracting a specific pattern out of binary values based that are prepared from the outputs of the delay circuits 181 to 184. A subtracter 186 provides a difference between the output "b" of the delay circuit 181 and the output "d" of the delay circuit 183. A sign inverter 187 inverts the sign of the output of the subtracter 186. A switch 188 selects one of the outputs of the subtracter 186 and sign inverter 187 according to the output "s" of the decoder 185. A latch 189 samples and holds the output of the switch 188 according to the output "h" of the decoder 185. The output of the latch 189 is the output of the phase comparator 172.

The operation of the phase comparator 172 will be explained.

The delay circuits 181 to 184 successively delay digital signals provided by the A/D converter 171. The subtracter 186 calculates a difference between the output b of the delay circuit 181 and the output d of the delay circuit 183 and provides ternary eye patterns of FIG. 19B. In FIG. 18, a, b, c, d, and e represent the most significant bits (MSBs) of the outputs of the A/D converter 171 and delay circuits 181 to 184, respectively. If the A/D converter 171 is set so that the conversion range thereof agrees with an average of the baseband signal, the output bits a to e will be binary bits. The decoder 185 decodes the binary bits according to a specific logic and provides the output signals s and h. The signal s is used to let the switch 188 select one of the outputs of the subtracter 186 and sign inverter 187. The output of the switch 188 is sampled and held by the latch 189 in response to the signal h.

Figure 19B:
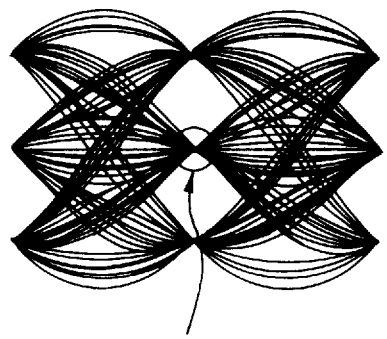

The signals s and h will be explained. The eye patterns of FIG. 19B correspond to the outputs of the delay circuits 181 and 183 and to the difference between the eye patterns of FIG. 19A and those obtained by delaying the eye patterns of FIG. 19A by two periods of the clock signal. The eye patterns of FIG. 19B provide three values at sampling points. Each signal that crosses a transition level (zero level) of the eye patterns has an inclination that is proportional to a difference between the phase of the baseband signal and a sampled phase. The inclination is positive or negative. The decoder 185 carries out the specific logic operation so that the signal s indicates the polarity of the inclination and the signal h indicates a crossing point where the signal crosses the transition level. As a result, an average of the output of the phase comparator 172 is proportional to a difference between the phase of the baseband signal and a sampled phase.

To provide such signals s and h, the specific logic operation is carried out as follows:

$h = (b \oplus d) + /a/c/e + ace$ $s = c$ where $\oplus$ is an EXOR.

This logic is true if the output bits a to e are correct. As a phase difference between the baseband signal supplied to the A/D converter 171 and the recovered clock signal provided by the VCO 174 increases, the output of the phase comparator 172 involves more errors. As the errors increase, an average of the output of the phase comparator 172 approaches zero, to show the characteristic curve of FIG. 20.

According to the PLL circuit of the prior art, the recovered clock signal is generated to sample a maximum point of the opening of the eye patterns of the analog baseband signal supplied to the PLL circuit.

Figure 20:
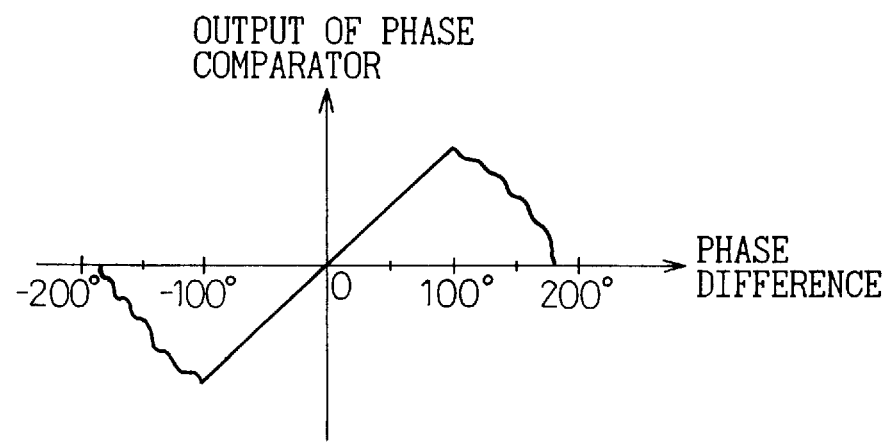
FIG. 20 shows the characteristic curve of the phase comparator of FIG. 18.

The above-described prior art has the following problems:

(1) The PLL circuit gradually eliminates a frequency difference while the phase difference between the baseband signal and the output of the VCO alternates between –180 and 180 degrees. The prior art controls the latch 189 according to an N-bit binary pattern formed from the digital data pieces a to e. When the phase difference becomes larger than, for example, 100 degrees, the output of the phase comparator starts to decrease as shown in FIG. 20. When the phase difference reaches 180 degrees, the output of the phase comparator becomes zero. When the phase difference is in the range of –180 to –100 degrees, the output of the phase comparator again increases. Namely, the characteristic of the phase comparator is nonlinear if the phase difference is in the range of 100 to 180 degrees or in the range of –180 to –100 degrees. This means that the PLL circuit is unable to reduce a frequency difference if the phase difference is large. This results in elongating a lockup time.

(2) The prior art determines whether or not the baseband signal crosses the transition level and whether the inclination of the baseband signal at a transition-level crossing point is negative or positive according to the N-bit binary pattern formed from the digital data pieces a to e. If the baseband signal involves an offset, the digital data pieces a to e will erroneously be converted into the N-bit binary pattern to destabilize the operation of the PLL circuit.

Next, preferred embodiments of the present invention will be explained.

Figure 1:
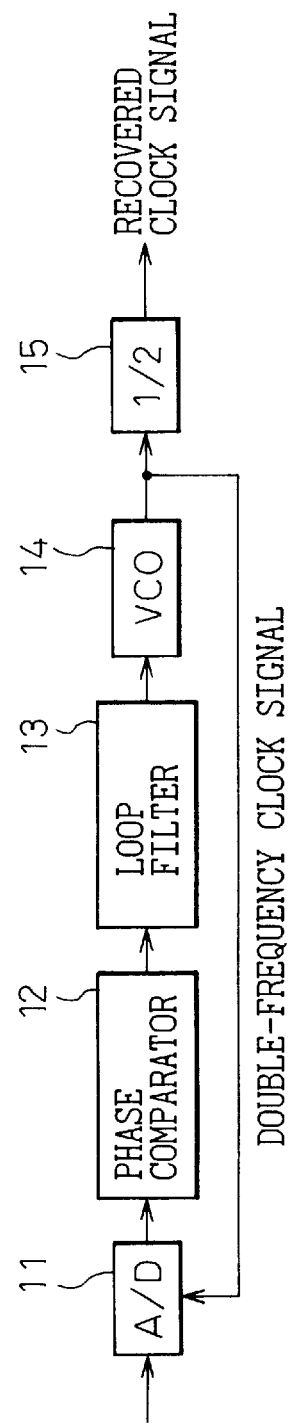
FIG. 1 shows a basic structure of a digital PLL circuit according to the present invention.

FIG. 1 shows a basic structure of a digital PLL circuit according to the present invention. An A/D converter 11 and a loop filter 13 are the same as the A/D converter 171 and loop filter 173 of the prior art of FIG. 17. The oscillation frequency of a VCO 14 of FIG. 1 is twice as large as that of the VCO 174 of the prior art of FIG. 17. The present invention additionally has a ½ frequency divider 15. A phase comparator 12 is characteristic to the present invention and differs from the phase comparator 171 of the prior art.

Although the phase comparators of the following first to fourth embodiments are different from one another, any one of them serves as the phase comparator 12 of FIG. 1, and therefore, each is represented with "12." The A/D converter 11, loop filter 13, VCO 14, and ½ frequency divider 15 are common for the embodiments.

First Embodiment

Figure 2:
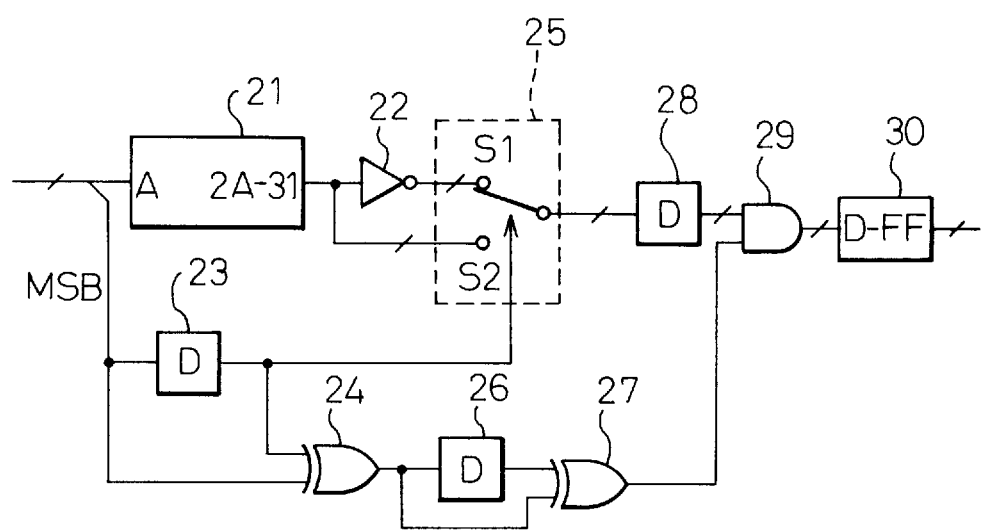
FIG. 2 shows a phase comparator for the PLL circuit of FIG. 1 according to a first embodiment of the present invention.

FIG. 2 shows the phase comparator 12 according to the first embodiment of the present invention. The A/D converter 11 receives an analog baseband signal and provides the phase comparator 12 with a 5-bit digital value A. A decoder 21 of the phase comparator 12 doubles the value A and subtracts 31, which is the maximum of a 5-bit number, therefrom. A sign inverter 22 multiplies the output of the decoder 21 by −1. A delay circuit 23 delays the most significant bit (MSB) of the 5-bit value by a period of a clock signal provided by the VCO 14. The frequency of this clock signal is double the frequency of a recovered clock signal provided by the ½ frequency divider 15. An EXOR gate 24 receives the MSB of the output of the A/D converter 11 and the output of the delay circuit 23. A switch 25 selects S1 if the delay circuit 23 provides 1 and S2 if it provides 0. A delay circuit 26 delays the output of the EXOR gate 24 by a period of the double-frequency clock signal shown in FIG. 1. An EXOR gate 27 receives the output of the EXOR gate 24 and the output of the delay circuit 26. A delay circuit 28 delays the output of the switch 25 by a period of the double-frequency clock signal. A multiplier 29 passes the output of the switch 25 if the output of the EXOR gate 27 is 1 and provides 0 if the same is 0. A D-type flip-flop (D-FF) 30 latches the output of the multiplier 29 according to the recovered clock signal (FIG. 1).

If the A/D converter 11 is set so that the center of the conversion range thereof agrees with an average of the baseband signal applied to the A/D converter 11, a transition level, that is, a zero crossing level of the baseband signal will be equal to an average of the baseband signal and equal to an intermediate value between 10000 and 01111 because the A/D converter 11 provides a 5-bit output.

Figure 3:
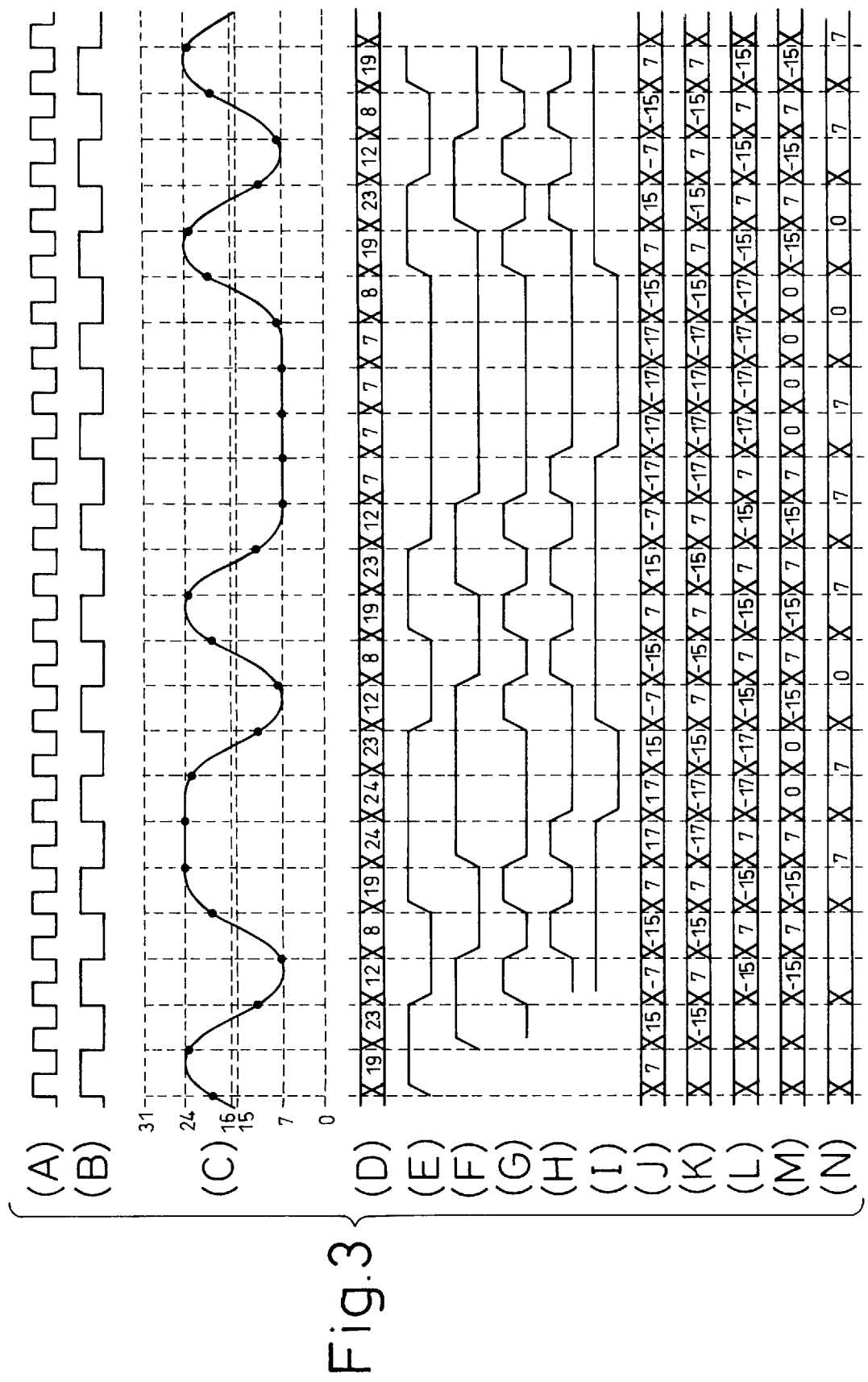
FIG. 3 shows the operation of the phase comparator of FIG. 2 with a recovered clock signal being behind a baseband signal by 45 degrees.

FIG. 3 shows the operation of the phase comparator 12 of FIG. 2 with the phase of the recovered clock signal being behind the phase of the baseband signal by 45 degrees.

The baseband signal ((C) of FIG. 3) applied to the A/D converter 11 has a limited frequency band due to removal of high-frequency components. The A/D converter 11 samples the baseband signal in response to, for example, each rise of the double-frequency clock signal ((A) of FIG. 3) provided by the VCO 14 and provides a sampled 5-bit value A ((D) of FIG. 3). The sampled value A is supplied to the phase comparator 12. The decoder 21 of the phase comparator 12 subtracts 15.5, which is the intermediate value of the baseband signal and serves as a transition level, from the sampled value A and doubles the difference. Namely, the decoder 21 provides the double of the difference between the sampled value A and the transition level, as indicated with (J) of FIG. 3. The most significant bit (MSB) of the sampled 5-bit value A indicates whether or not the value A is larger than 15.5, as indicated with (E) of FIG. 3. This MSB is supplied to the delay circuit 23. The delay circuit 23 delays the MSB by a period of the double-frequency clock signal, as indicated with (F) of FIG. 3. The output of the delay circuit 23 is used to determine the sign of the output of the decoder 21. If the sampled value A (FIG. 3(D)) is larger than 15.5, the sign of the output of the decoder 21 is inverted by the sign inverter 22 and is passed through the switch 25. If the sampled value A is smaller than 15.5, the switch 25 passes the output of the decoder 21 as it is, as indicated with (K) of FIG. 3. The delay circuit 28 delays the output of the switch 25 by a period of the double-frequency clock signal, as indicated with (L) of FIG. 3.

The EXOR gate 24 provides an EXOR of the MSB of the sampled value A and the output of the delay circuit 23. The EXOR gate 27 provides an EXOR of the output ((G) of FIG. 3) of the EXOR gate 24 and the output ((H) of FIG. 3) of the delay circuit 26. If the output ((I) of FIG. 3) of the EXOR gate 27 is 1, it is determined that the baseband signal has crossed the transition level, i.e., the intermediate value of 15.5, and if it is 0, it is determined that the baseband signal has not crossed the transition level. The multiplier 29 provides the output of the switch 25 only when the baseband signal has just crossed the transition level, as indicated with (M) of FIG. 3. The flip-flop 30 latches the output of the multiplier 29 in response to, for example, a rise of the recovered clock signal ((B) of FIG. 3) for a period of the recovered clock signal, as indicated with (N) of FIG. 3. When the baseband signal crosses the transition level, the baseband signal is substantially linear and inclines about 45 degrees with respect to a time axis. At this time, the output of the multiplier 29, i.e., the double of the difference between the transition level and the value sampled in the preceding period of the double-frequency clock signal corresponds to a time difference between the sampling point and the crossing point.

The flip-flop 30 provides a value of +7 at proper intervals, to advance the recovered clock signal to zero the delay of 45 degrees.

Figure 4:
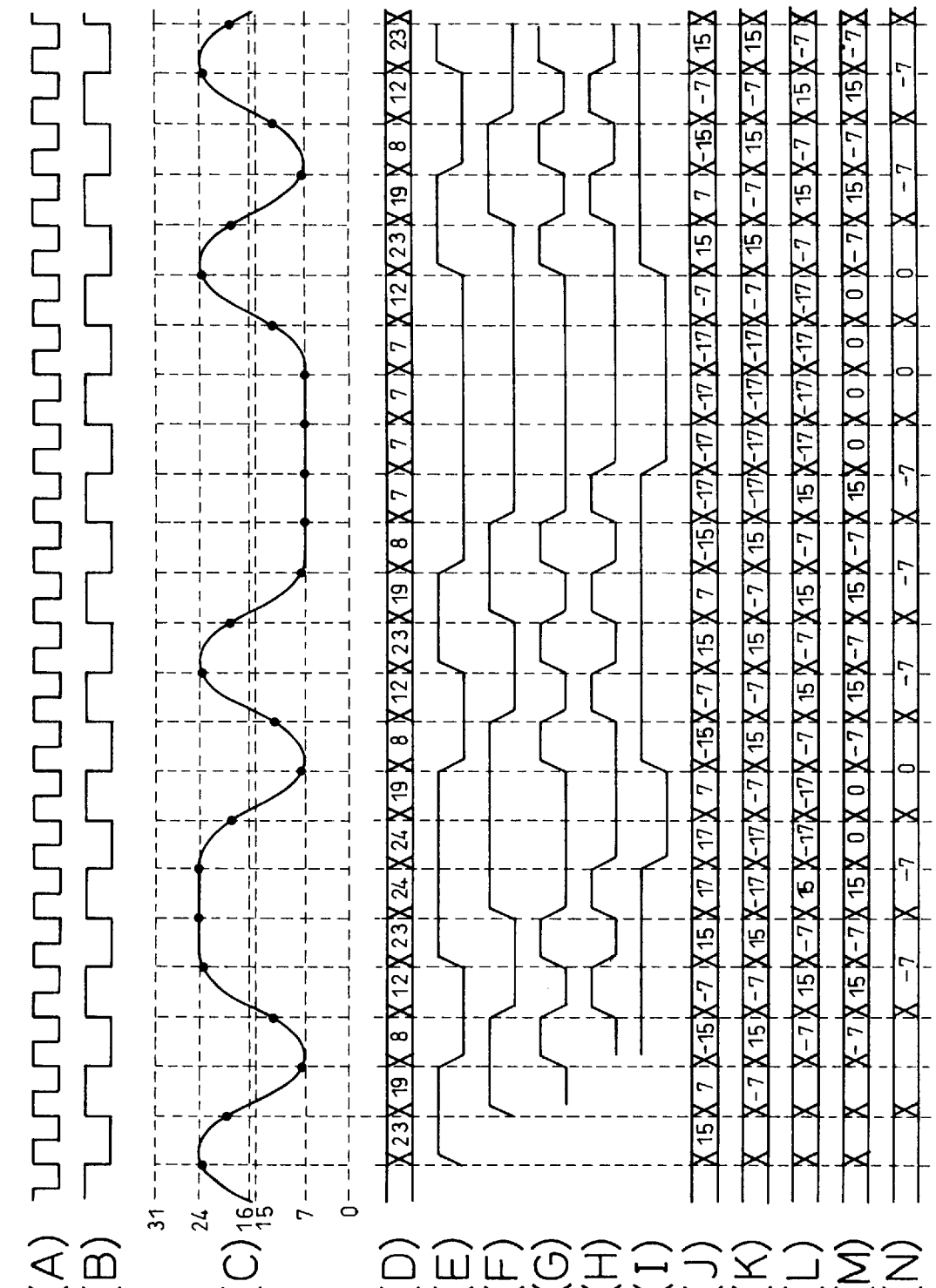
FIG. 4 shows the operation of the phase comparator of FIG. 2 with the recovered clock signal being ahead of the baseband signal by 45 degrees.

FIG. 4 shows the operation of the phase comparator 12 of FIG. 2 with the phase of the recovered clock signal being ahead of the phase of the baseband signal by 45 degrees.

In this case, the flip-flop 30 provides a value of −7 at proper intervals to advance the recovered clock signal to zero the advance of 45 degrees. The polarity of the VCO 14 is set so that the frequency thereof may decrease when the output of the loop filter 13 drops. Then, a rise of the recovered clock signal agrees with a transition-level crossing point of the baseband signal.

Although the phase of the recovered clock signal is behind or ahead of the phase of the baseband signal by 45 degrees in FIGS. 3 and 4, the phase comparator of FIG. 2 is able to zero a delayed or advanced phase difference of any angles.

Figure 5:
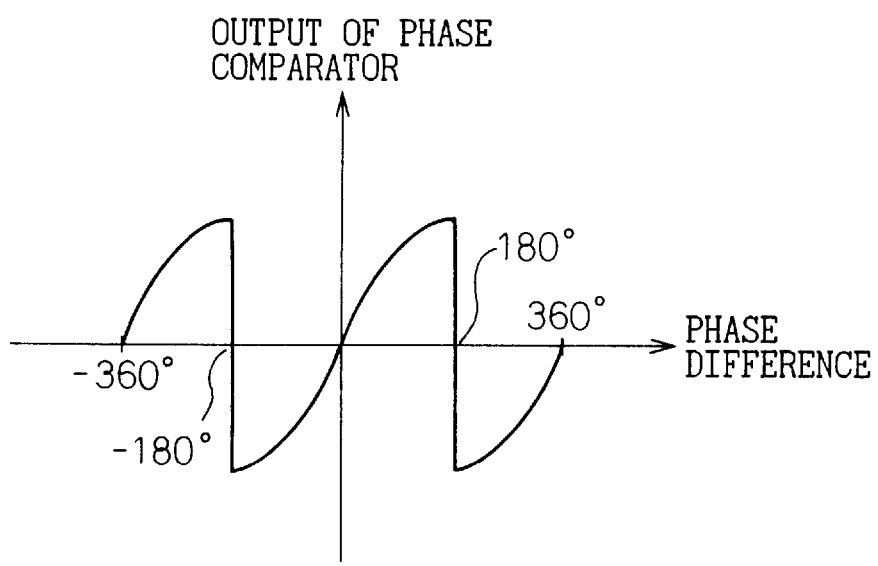
FIG. 5 shows the characteristic curve of the phase comparator of FIG. 2.

FIG. 5 shows the characteristic curve of the phase comparator of FIG. 2. The polarity of the VCO 14 of FIG. 1 is set to increase the frequency thereof when the output of the loop filter 13 increases and to decrease the same when the output of the loop filter 13 drops. Then, the digital PLL circuit recovers a clock signal with each rise thereof synchronizing with a transition-level crossing point of the baseband signal.

Second Embodiment

Figure 6:
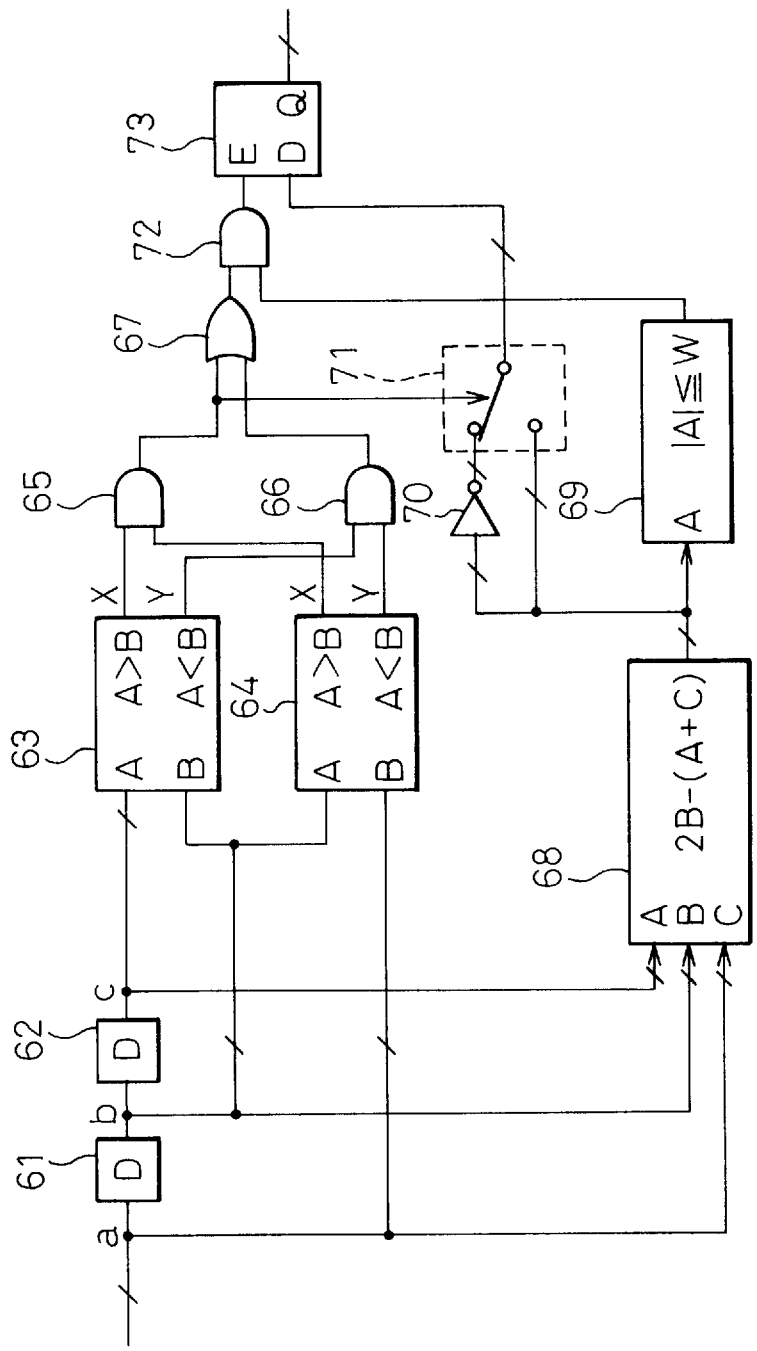
FIG. 6 shows a phase comparator for the PLL circuit of FIG. 1 according to a second embodiment of the present invention.

FIG. 6 shows the phase comparator 12 according to the second embodiment of the present invention. The A/D converter 11 receives an analog baseband signal and provides a 5-bit output. A delay circuit 61 delays the output of the A/D converter 11 by a period of the double-frequency clock signal (FIG. 1). A delay circuit 62 delays the output of the delay circuit 61 by a period of the double-frequency clock signal. A decoder 63 receives the output "b" of the delay circuit 61 and the output "c" of the delay circuit 62. If c>b, an output terminal X of the decoder 63 provides 1. If c≦b, the output terminal X provides 0. If c<b, an output terminal Y of the decoder 63 provides 1. If c≧b, the output terminal Y provides 0. A decoder 64 receives the output b of the delay circuit 61 and the output a of the A/D converter 11. If b>a, an output terminal X of the decoder 64 provides 1. If b≦a, the output terminal X provides 0. If b<a, an output terminal Y of the decoder 64 provides 1. If b≧a, the output terminal Y provides 0. An AND gate 65 receives the X-outputs of the decoders 63 and 64. An AND gate 66 receives the Y-outputs of the decoders 63 and 64. An OR gate 67 receives the outputs of the AND gates 65 and 66. A decoder 68 receives the output "a" of the A/D converter, the output "b" of the delay circuit 61, and the output "c" of the delay circuit 62 and provides "2b−(a+c)." A decoder 69 provides 1 if the absolute value of the output of the decoder 68 is equal to or smaller than a threshold W and 0 if the same is larger than W. A sign inverter 70 multiplies the output of the decoder 68 by −1. A switch 71 provides the output of the sign inverter 70 if the AND gate 65 provides 1 and the output of the decoder 68 if the same provides 0. An AND gate 72 receives the outputs of the OR gate 67 and decoder 69. A D-type flip-flop 73 serves as an output controller and latches the output of the switch 71 in response to the recovered clock signal (FIG. 1) if the AND gate 72 provides 1, and keeps the present value if the same provides 0.

Figure 7:
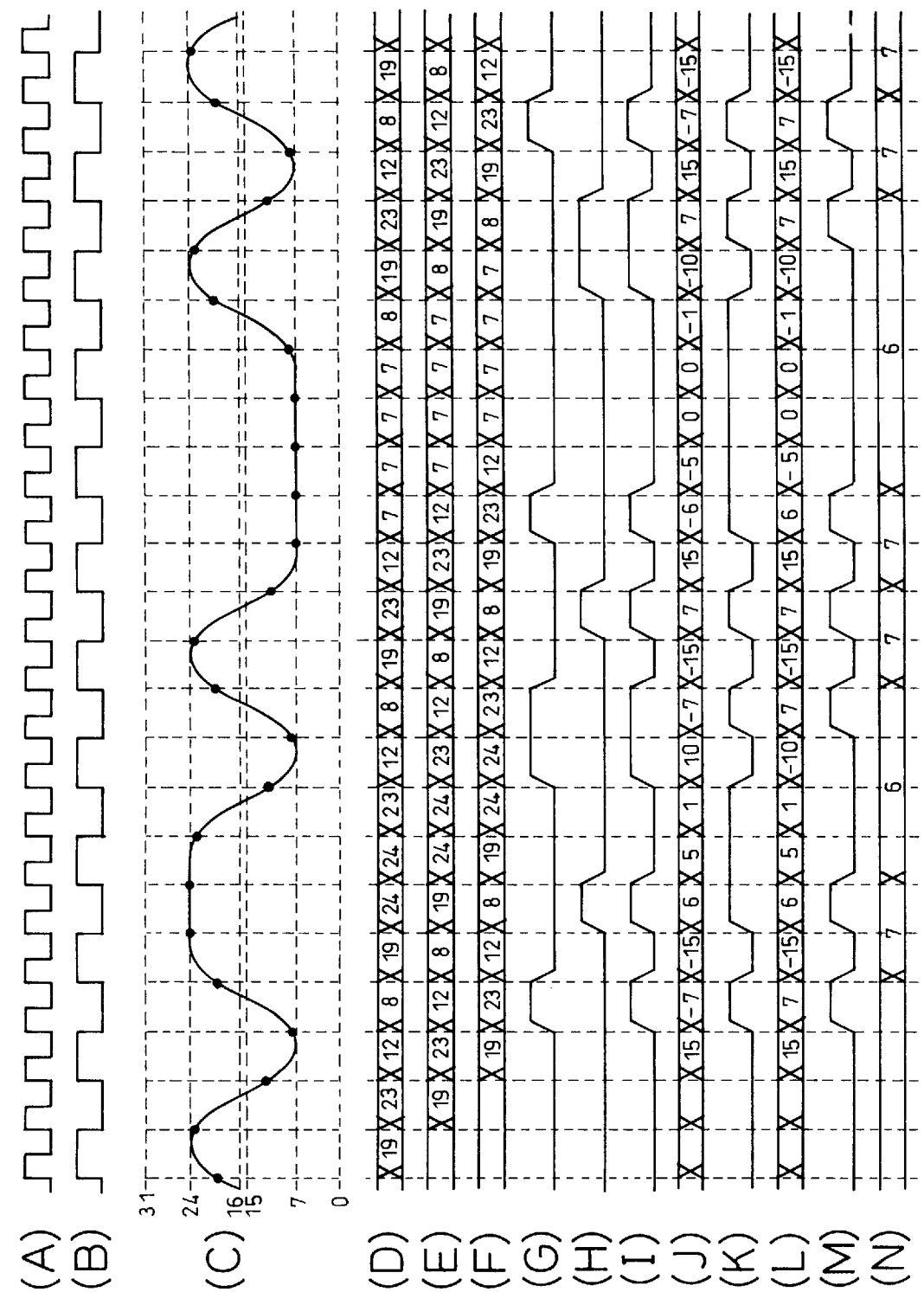
FIG. 7 shows the operation of the phase comparator of FIG. 6 with a recovered clock signal being behind a baseband signal by 45 degrees.

FIG. 7 shows the operation of the phase comparator 12 of FIG. 6 with the phase of the recovered clock signal being behind the phase of the baseband signal by 45 degrees.

(A) to (D) of FIG. 7 are the same as those of FIG. 4. The A/D converter 11 serves as a first delay circuit and provides the output a. (E) of FIG. 7 is the output b of the delay circuit 61, and (F) is the output c of the delay circuit 62. If c>b>a, it is a monotonous decrease, and the AND gate 65 provides 1 as indicated with (G) of FIG. 7. If c<b<a, it is a monotonous increase, and the AND gate 66 provides 1 as indicated with (H) of FIG. 7. As a result, the output of the OR gate 67 is as indicated with (I) of FIG. 7.

The decoder 68 calculates "2b−(a+c)" and provides (J) of FIG. 7. Only when the absolute value of the output of the decoder 68 is equal to or smaller than the threshold W, the decoder 69 provides the AND gate 72 with 1, as indicated with (K) of FIG. 7. The threshold W is 7 in this embodiment.

If the AND gate 65 provides 1 to indicate a monotonous decrease, the switch 71 provides an inversion of the output of the decoder 68, and in the other case, the output of the decoder 68 as it is, as indicated with (L) of FIG. 7. If the AND gate 72 provides 1, the outputs a, b, and c indicate a monotonous increase or decrease and a phase difference is equal to or smaller than the threshold W, as indicated with (M) of FIG. 7. The output of the AND gate 72 is supplied to an enable terminal E of the output controller 73. Only when the AND gate 72 provides 1, the output controller 73 latches the output of the switch 71, and when the AND gate 72 provides 0, the output controller 73 keeps the preceding value, as indicated with (N) of FIG. 7.

While the baseband signal is monotonously increasing or decreasing, the sampled values a and c are substantially symmetrical with respect to the transition level, and the sampled value b is substantially an intermediate value between the values a and c. Accordingly, "2b−(a+c)" calculated by the decoder 68 corresponds to a time difference between the sampling point of the sampled value b and the transition-level crossing point if the baseband signal is monotonously increasing or decreasing.

If "2b−(a+c)" is equal to or smaller than the threshold W, the baseband signal is in the vicinity of the crossing point.

Accordingly, it is sure that "2b−(a+c)" corresponds to the time difference between the sampling point and the crossing point.

Figure 8:
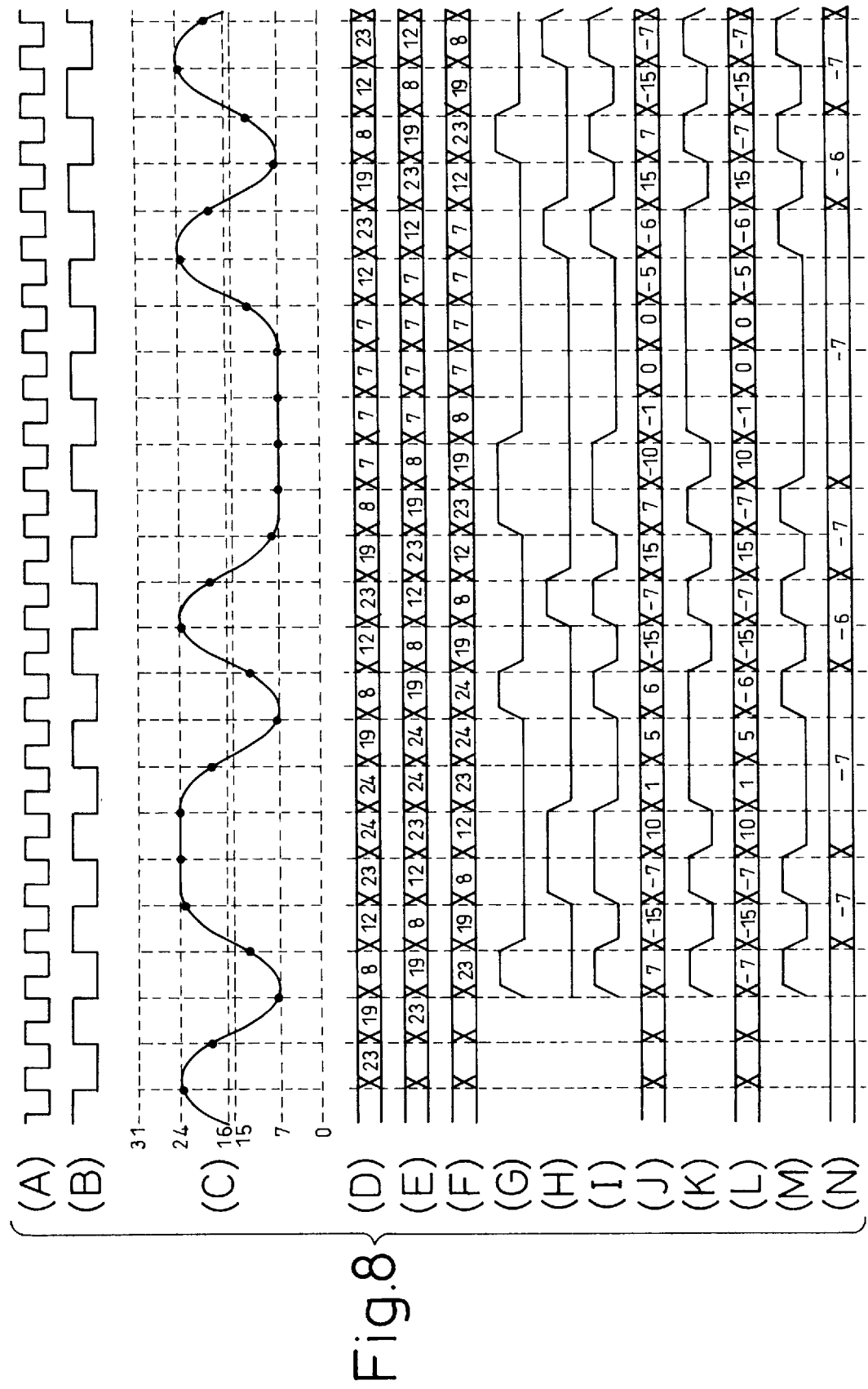
FIG. 8 shows the operation of the phase comparator of FIG. 6 with the recovered clock signal being ahead of the baseband signal by 45 degrees.

FIG. 8 shows the operation of the phase comparator 12 of FIG. 6 with the phase of the recovered clock signal being ahead of the phase of the baseband signal by 45 degrees.

In this case, the output controller 73 provides a negative value at proper intervals to zero the advance of 45 degrees. The polarity of the VCO 14 is set so that the frequency thereof may decrease when the output of the loop filter 13 drops. Then, a rise of the recovered clock signal agrees with a transition-level crossing point of the baseband signal.

Although the phase of the recovered clock signal is behind or ahead of the phase of the baseband signal by 45 degrees in FIGS. 7 and 8, the phase comparator of FIG. 6 is able to zero a delayed or advanced phase difference of any angles.

Figure 9:
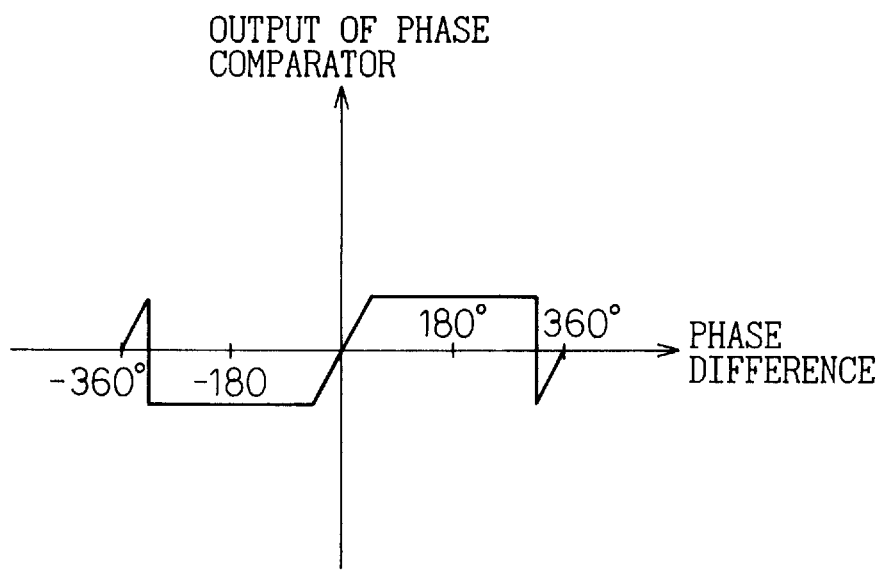
FIG. 9 shows the characteristic curve of the phase comparator of FIG. 6.

FIG. 9 shows the characteristic curve of the phase comparator of FIG. 6. The polarity of the VCO 14 is set to increase the frequency thereof when the output of the loop filter 13 increases and to decrease the same when the output of the loop filter 13 drops. Then, the digital PLL circuit recovers a clock signal with each rise thereof synchronizing with a transition-level crossing point of the baseband signal.

In FIG. 6, the decoder 69 and AND gate 72 may be omitted, and the output of the OR gate 67 may be directly connected to the enable terminal E of the output controller 73. This modification does not check to see if "2b−(a+c)" is equal to or smaller than the threshold W and only determines whether or not the baseband signal is monotonously increasing or decreasing. This is also proper for providing the effect of the present invention.

Third Embodiment

Figure 10:
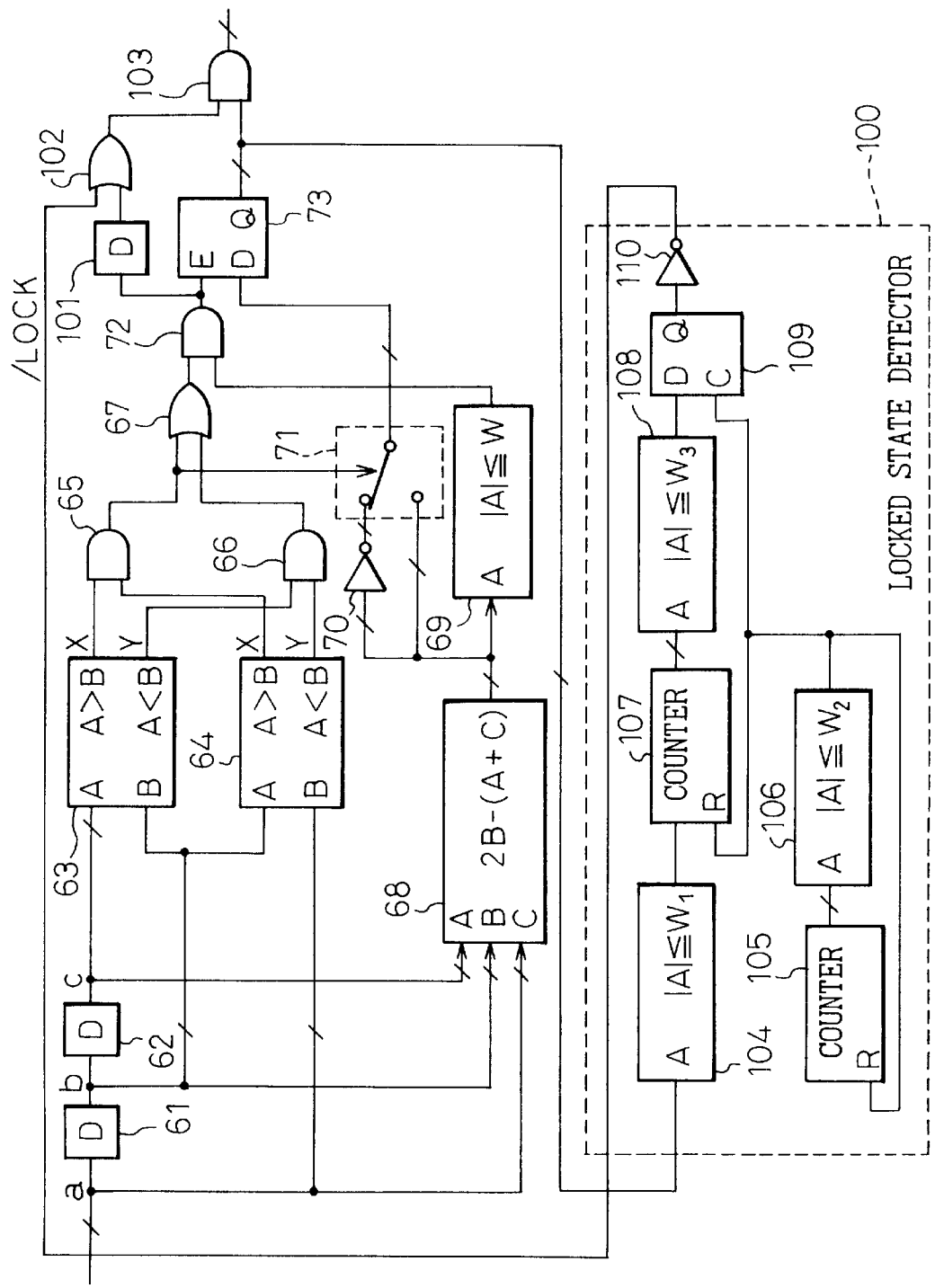
FIG. 10 shows a phase comparator for the PLL circuit of FIG. 1 according to a third embodiment of the present invention.

FIG. 10 shows the phase comparator 12 according to the third embodiment of the present invention. The elements 61 to 73 of FIG. 10 are the same as those of FIG. 6. A D-type flip-flop 101 serves as a delay circuit and latches the output of the AND gate 72 in response to a rise of a recovered clock signal ((B) of FIG. 11). An OR gate 102 receives the output of a NOT gate 110 and the output of the delay circuit 101. A multiplier 103 provides the output of the flip-flop 73 as it is if the OR gate 102 provides 1, and 0 if the OR gate 102 provides 0.

A locked-state detector 100 will be explained. A decoder 104 receives an output value from the flip-flop 73. If the absolute value of the output value is equal to or smaller than a threshold W1, the decoder 104 provides 1, and if not, 0. A counter 105 counts the number of rising edges of the recovered clock signal ((B) of FIG. 11) and is reset in response to a reset signal to a reset terminal R. A decoder 106 receives a count from the counter 105. If the count is larger than a threshold W2, the decoder 106 provides 1, and if the count is equal to or smaller than W2, 0. A counter 107 counts the number of 1s provided by the decoder 104 and is reset in response to a reset signal supplied to a reset terminal R. A decoder 108 receives a count from the counter 107. If the count is larger than a threshold W3, the decoder 108 provides 1, and if the count is equal to or smaller than W3, 0. A D-type flip-flop 109 latches the output of the decoder 108 in response to a rising edge of the output of the decoder 106. The NOT gate 110 inverts the output of the flip-flop 109.

Figure 11:
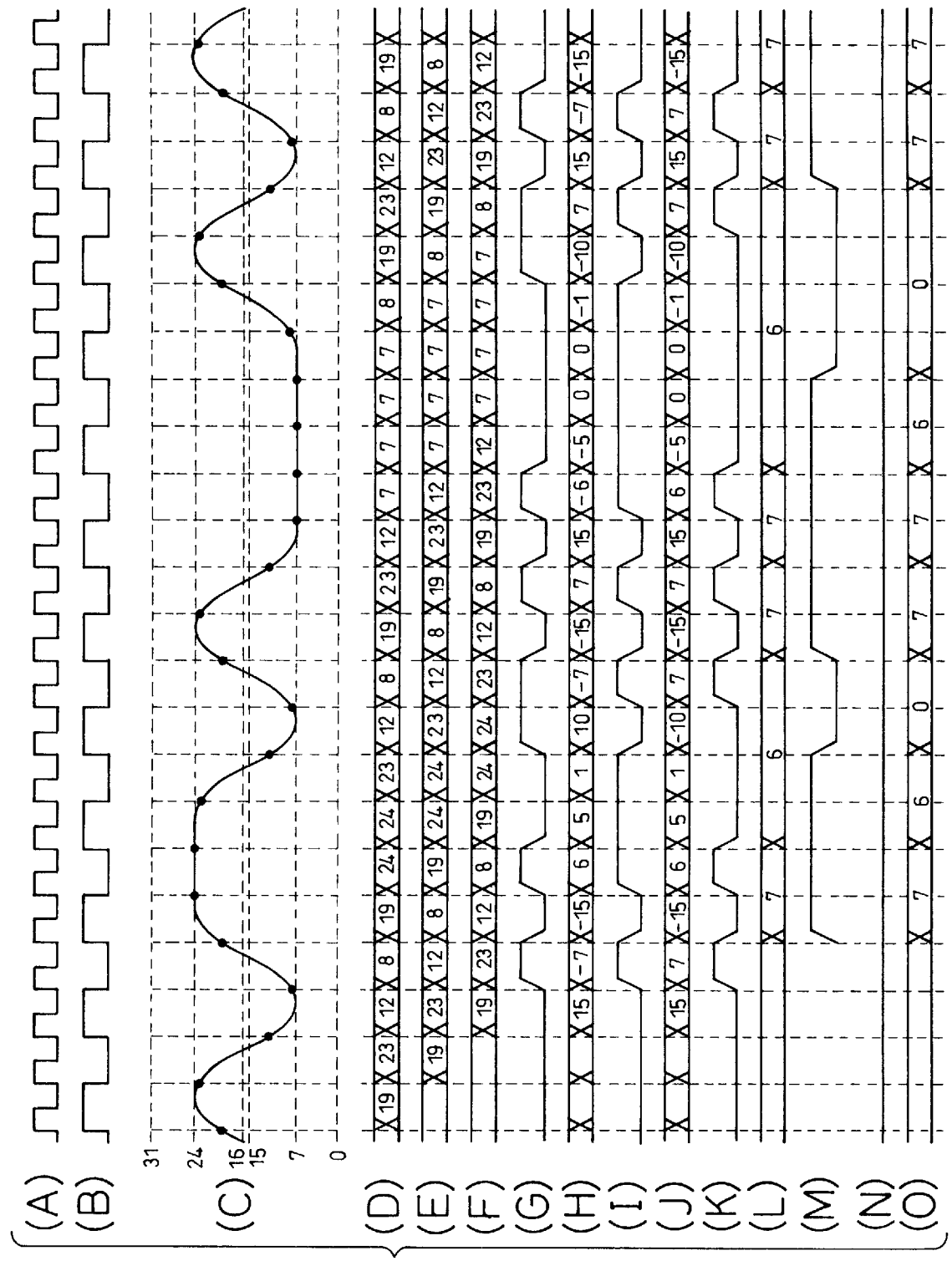
FIG. 11 shows the operation of the phase comparator of FIG. 10 with a recovered clock signal being behind a baseband signal by 45 degrees.

FIG. 11 shows the operation of the phase comparator 12 of FIG. 10 with the phase of the recovered clock signal being behind the phase of the baseband signal by 45 degrees.

(A) to (F) of FIG. 11 are the same as those of FIG. 7, and (G) to (L) of FIG. 11 are the same as (I) to (N) of FIG. 7.

In the locked-state detector 100, the decoder 104 determines whether or not the output ((L) of FIG. 11) of the flip-flop 73 is equal to or smaller than the threshold W1. The counter 107 counts the number of 1s provided by the decoder 104, which provides "1" whenever the output of the flip-flop 73 is equal to or smaller than W1. The counting operation of the counter 107 is carried out within the number W2 determined by the decoder 106. The decoder 108 determines whether or not the count of the counter 107 is larger than the threshold W3. When the count of the counter 105 reaches the number W2, the flip-flop 109 latches the output of the decoder 108. The output of the flip-flop 109 is inverted by the NOT gate 110. Consequently, the locked-state detector 100 provides 0 if the PLL circuit is locked and 1 if it is not locked.

In this way, the decoder 104 receives the output of the phase comparator of the second embodiment having the characteristic curve of FIG. 9. Accordingly, an input to the decoder 104 is always smaller than the threshold W for the decoder 69 if the PLL circuit is locked and if the baseband signal involves no noise. The threshold W1, therefore, is set to be slightly smaller than the threshold W. If the baseband signal involves a little noise, the output of the phase comparator of the second embodiment is mostly smaller than the threshold W1. Accordingly, the threshold W3 is set to be slightly smaller than the threshold W2.

As shown in FIG. 11, the delay circuit 101 provides 1 only when the output of the flip-flop 73 is made from sampled data. If an average of the output of the flip-flop 73 is small and the PLL circuit is locked, the multiplier 103 provides only the portion of the output of the flip-flop 73 that is made from sampled data. Namely, if the PLL circuit is locked, the multiplier 103 provides phase difference data that is prepared under the conditions that the sampled values a, b, and c are monotonously increasing or decreasing and that a phase difference is equal to or smaller than the threshold W. If an average of the output of the flip-flop 73 is large and the PLL circuit is not locked, the locked-state detector 100 provides 1 to disable the output of the delay circuit 101, so that the multiplier 103 provides the same output as that of the second embodiment.

Figure 12:
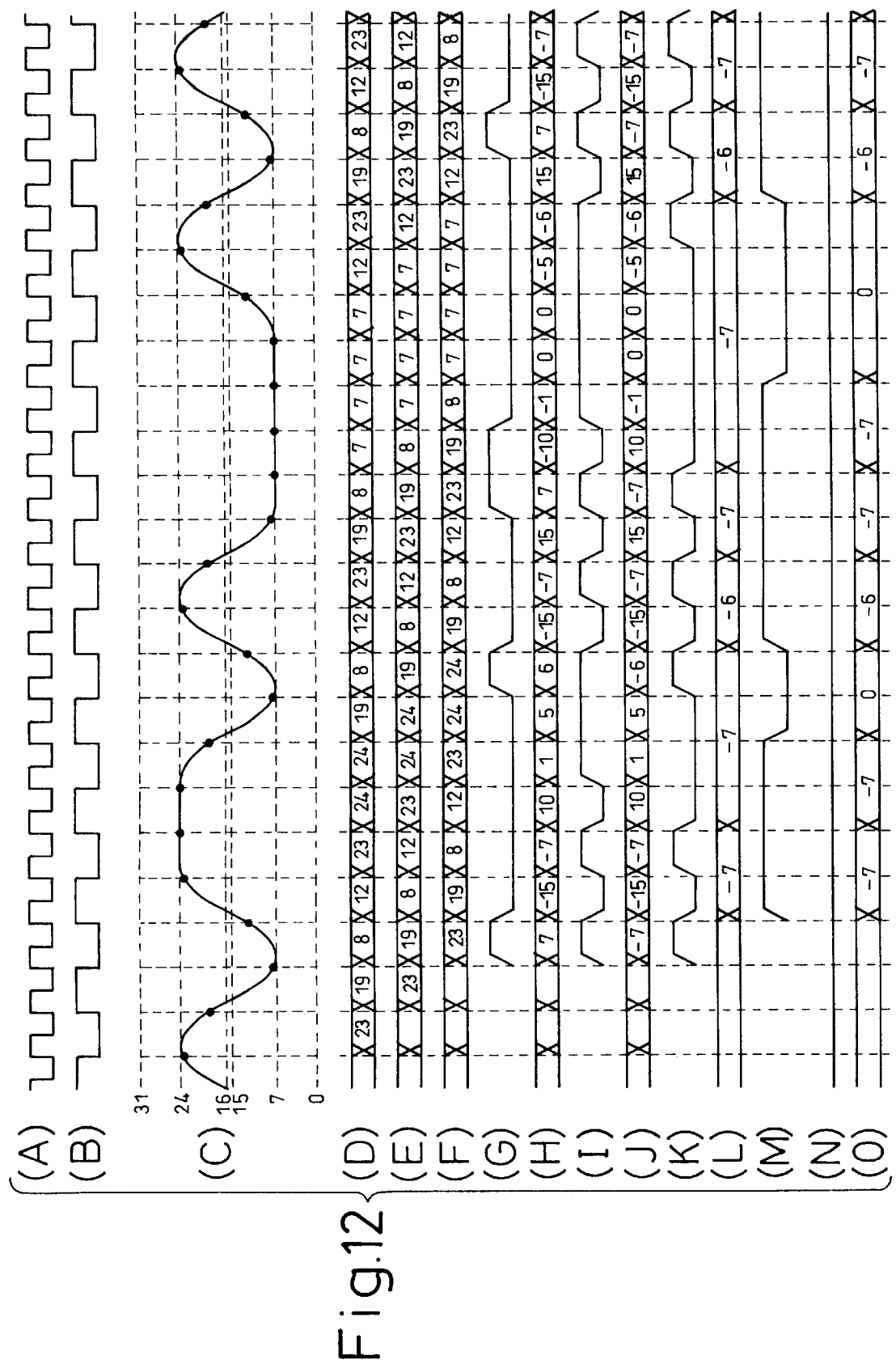
FIG. 12 shows the operation of the phase comparator of FIG. 10 with the recovered clock signal being ahead of the baseband signal by 45 degrees.

FIG. 12 shows the operation of the phase comparator 12 of FIG. 10 with the phase of the recovered clock signal being ahead of the phase of the baseband signal by 45 degrees.

(A) to (G) of FIG. 12 are the same as those of FIG. 8, and (H) to (L) of FIG. 12 are the same as (J) to (N) of FIG. 8. FIG. 12 differs from FIG. 11 in that the output ((O) of FIG. 12) of the multiplier 103 provides negative values to delay the phase of the recovered clock signal.

Figure 13:
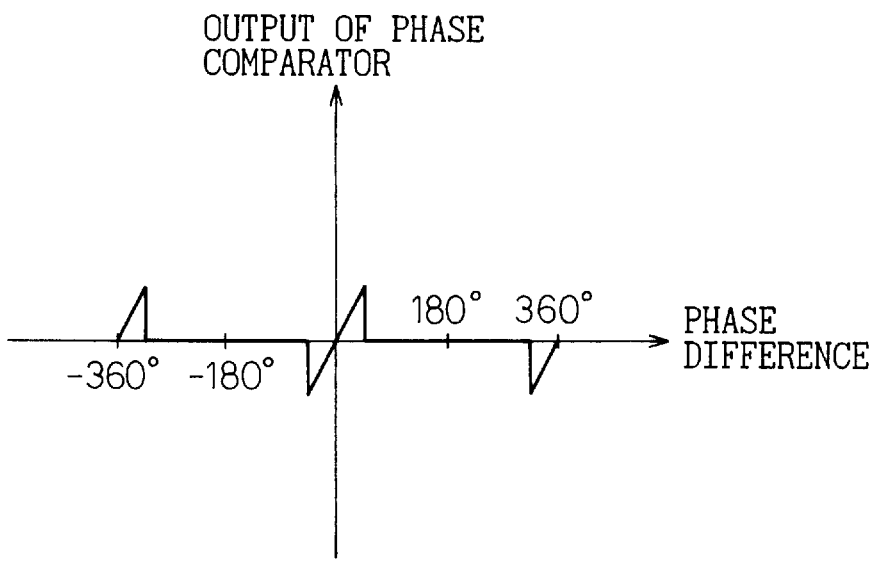
FIG. 13 shows the characteristic curve of the phase comparator of FIG. 10.

The characteristic curve of the phase comparator of the third embodiment is dependent on whether or not the PLL circuit is locked. If the PLL circuit is clocked, it is as shown in FIG. 9, and if the PLL circuit is not locked, it is as shown in FIG. 13.

Although the phase of the recovered clock signal is behind or ahead of the phase of the baseband signal by 45 degrees in FIGS. 11 and 12, the phase comparator of FIG. 10 is able to zero a delayed or advanced phase difference of any angle.

The polarity of the VCO 14 of FIG. 1 is set to increase the frequency thereof when the output of the loop filter 13 increases and to decrease the same when the output the loop filter 13 drops. Then, the digital PLL circuit recovers a clock signal with each rise thereof synchronizing with a transition-level crossing point of the baseband signal.

Fourth Embodiment

Figure 14:
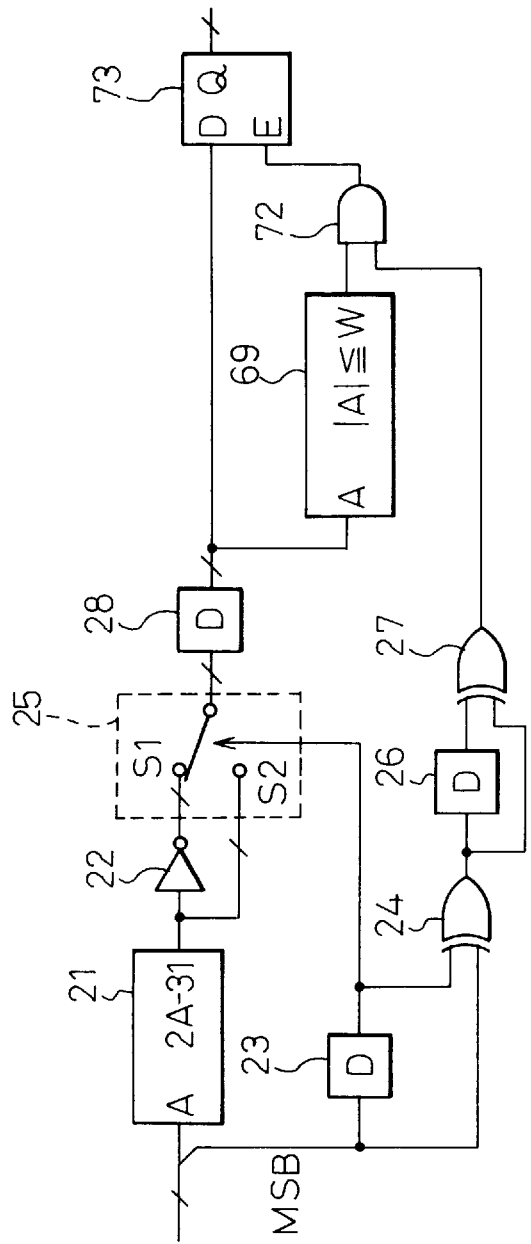
FIG. 14 shows a phase comparator for the PLL circuit of FIG. 1 according to a fourth embodiment of the present invention.

FIG. 14 shows the phase comparator 12 according to the fourth embodiment of the present invention. Elements 21 to 28 of FIG. 14 are the same as those of FIG. 2, and elements 69, 72, and 73 of FIG. 14 are the same as those of FIG. 6. Namely, the fourth embodiment is a combination of the phase comparator of the first embodiment and the circuit of the second embodiment for checking the absolute value of a phase difference.

Figure 15:
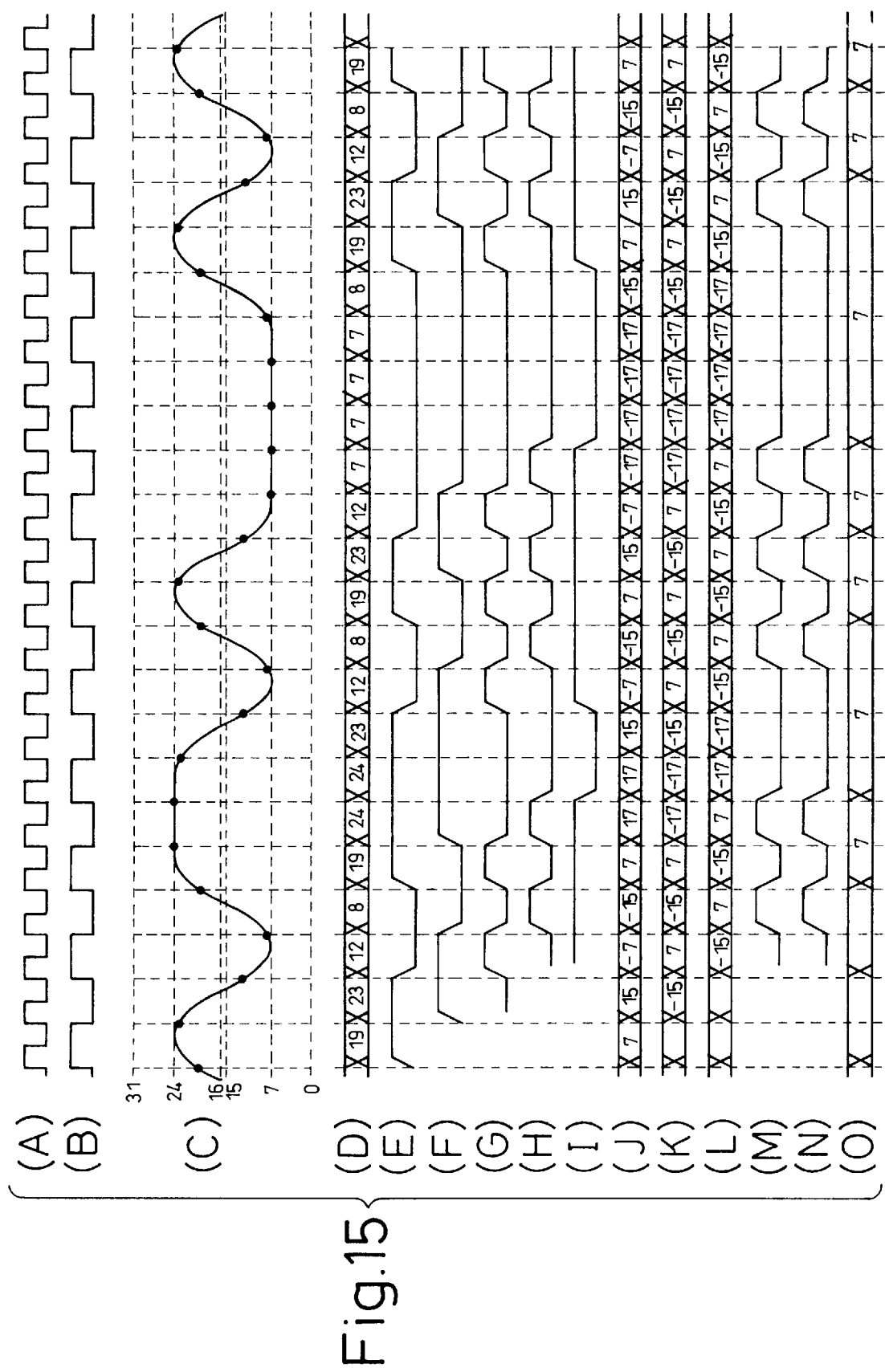
FIG. 15 shows the operation of the phase comparator of FIG. 14 with a recovered clock signal being behind a baseband signal by 45 degrees.

FIG. 15 shows the operation of the phase comparator 12 of FIG. 14 with the phase of a recovered clock signal being behind the phase of the baseband signal by 45 degrees.

(A) to (L) of FIG. 15 are the same as those of FIG. 3. The decoder 69 provides 1 if the output of the delay circuit 28 is equal to or smaller than a threshold W, and 0 if the output is larger than W. The threshold W is 7 in this embodiment. As explained in the first embodiment, the EXOR 27 provides 1 for a period of the recovered clock signal just after the baseband signal crosses the transition level. Accordingly, the AND gate 72 passes the output of the decoder 69 for a period of the recovered clock signal if a sampled value is equal to or smaller than the threshold W and if the baseband signal crosses the transition level. When the AND gate 72 provides 1, the flip-flop 73 latches the output of the delay circuit 28. As a result, the flip-flop 73 ((O) of FIG. 15) provides +7 to cancel the phase delay.

Figure 16:
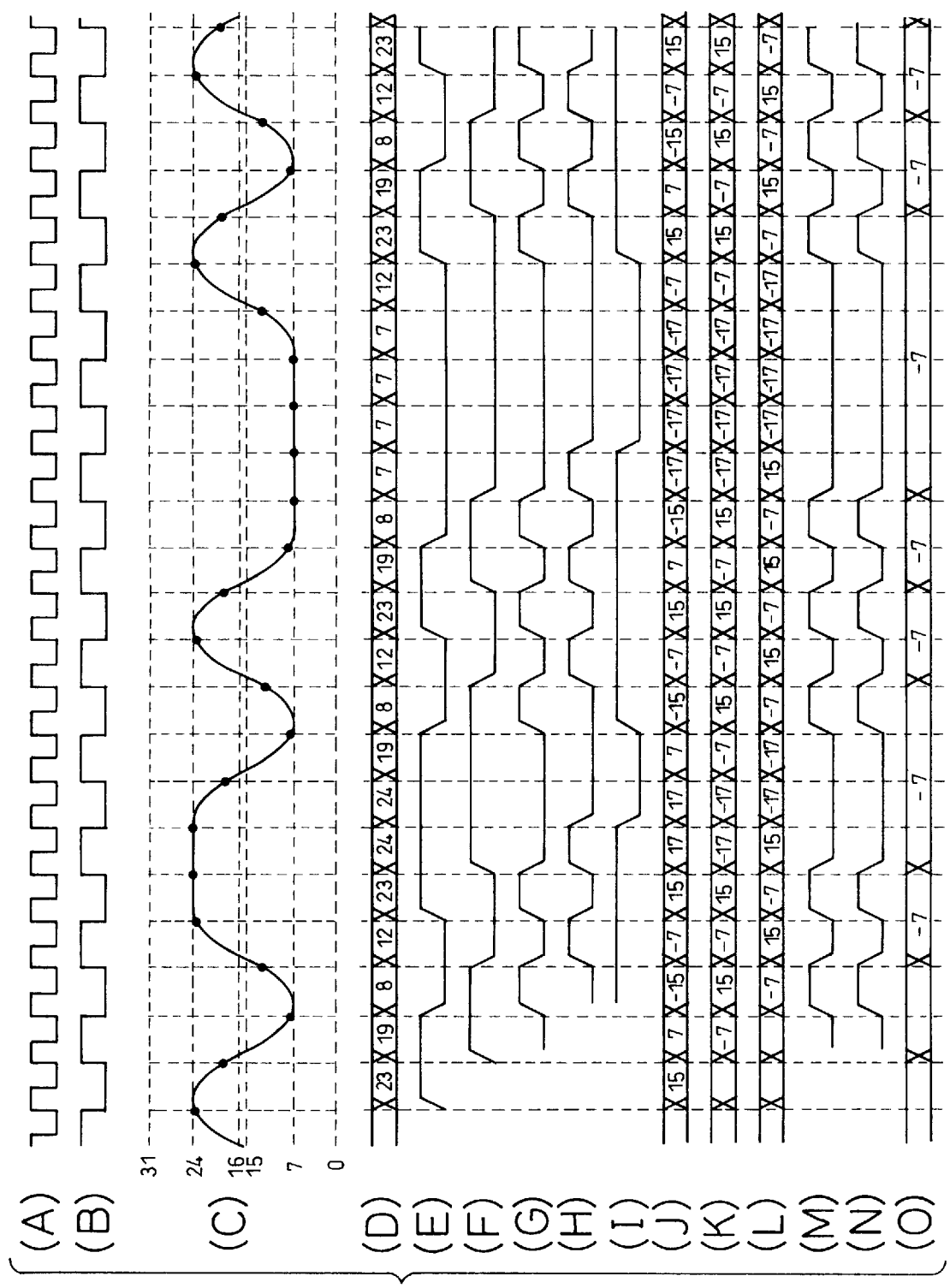
FIG. 16 shows the operation of the phase comparator of FIG. 14 with the recovered clock signal being ahead of the baseband signal by 45 degrees.

FIG. 16 shows the operation of the phase comparator 12 of FIG. 14 with the phase of the recovered clock signal being ahead of the phase of the baseband signal by 45 degrees. In this case, the flip-flop 73 ((O) of FIG. 16) provides −7 to cancel the phase advance.

According to the fourth embodiment, the output of the flip-flop 73 corresponding to a time difference between a sampling point and a transition-level crossing point is always equal to or smaller than the threshold W. Accordingly, the fourth embodiment more surely synchronizes the recovered clock signal with the baseband signal than the first embodiment.

Each of the first to fourth embodiments refers to binary values sampled from a baseband signal and sets the polarity of a control value corresponding to a time difference to positive if the phase of a recovered clock signal is behind the phase of the baseband signal, and negative if the phase of the recovered clock signal is ahead of the phase of the baseband signal. The sign of the control value may be inverted if the characteristics of the VCO are so selected.

What is claimed is:

1. A digital PLL circuit for recovering a clock signal from an analog baseband signal whose frequency band is limited due to removal of high-frequency components, having an A/D converter for sampling the baseband signal according to the recovered clock signal, a phase comparator for detecting a phase difference between the output of the A/D converter and the recovered clock signal, a loop filter for integrating the phase difference, and a voltage-controlled oscillator (VCO) for changing the oscillation frequency of itself in response to the output of the loop filter and providing the recovered clock signal, the phase comparator comprising:

transition level crossing device for determining whether or not the base band signal has crossed a transition level; and control value providing device for providing the loop filter with a control value for a period of the recovered clock signal after said determination is made, the control value corresponding to a time difference between a sampling point and a transition-level crossing point of the baseband signal when the determination is that the baseband signal has crossed the transition level, and the control value corresponding to 0 when the determination is that the baseband signal has not crossed the transition level.

2. The digital PLL circuit of claim 1, wherein the frequency of the recovered clock signal is double the nominal frequency of the baseband signal, and the A/D converter samples the baseband signal according to the double-frequency clock signal.

3. The digital PLL circuit of claim 1, wherein the time difference corresponds to a difference between a value sampled at the sampling point and the transition level.

4. The digital PLL circuit of claim 1, wherein the phase comparator determines the sign of the control value according to a binary value sampled from the baseband signal in a preceding period of the recovered clock signal and whether the phase of the recovered clock signal is ahead of or behind the phase of the baseband signal.

* * * * *